United States Patent
Li et al.

(10) Patent No.: US 7,973,598 B2
(45) Date of Patent: Jul. 5, 2011

(54) AUDIO POWER AMPLIFIER AND A PRE-AMPLIFIER THEREOF

(75) Inventors: Po-Yu Li, Sinshih Township, Tainan County (TW); Kuan-Jen Tseng, Sinshih Township, Tainan County (TW)

(73) Assignee: Himax Analogic, Inc. (TW)

( * ) Notice: Subject to any disclaimer, the term of this patent is extended or adjusted under 35 U.S.C. 154(b) by 0 days.

(21) Appl. No.: 12/690,380

(22) Filed: Jan. 20, 2010

(65) Prior Publication Data

US 2010/0117739 A1    May 13, 2010

Related U.S. Application Data

(62) Division of application No. 12/049,567, filed on Mar. 17, 2008, now Pat. No. 7,714,646.

(51) Int. Cl.
*H03F 1/36* (2006.01)

(52) U.S. Cl. .................................................... 330/86

(58) Field of Classification Search .................. 330/86, 330/110, 260
See application file for complete search history.

(56) References Cited

U.S. PATENT DOCUMENTS

| 6,118,336 A | 9/2000 | Pullen et al. ................. 330/10 |
| 7,352,238 B2 * | 4/2008 | Elwan et al. .................. 330/86 |
| 7,456,686 B2 | 11/2008 | Nadd ............................ 330/10 |
| 2009/0102550 A1 | 4/2009 | Ohama et al. ................ 330/10 |

* cited by examiner

*Primary Examiner* — Robert Pascal
*Assistant Examiner* — Khiem D Nguyen
(74) *Attorney, Agent, or Firm* — Hayes Soloway P.C.

(57) ABSTRACT

An audio power amplifier includes a pre-amplifier, an error amplifier, a comparator, a bridge circuit, and a feedback circuit, in which the gain of the pre-amplifier gradually increases when the audio power amplifier is powered on. The comparator generates a PWM signal by comparing a reference signal and an amplified audio signal. The bridge circuit has switches controlled according to the PWM signal such that a driving current alternately flows to and from a load. The feedback circuit generates the feedback signal indicating a condition of the load.

1 Claim, 3 Drawing Sheets

AUDIO POWER AMPLIFIER AND A PRE-AMPLIFIER THEREOF

CROSS-REFERENCE

The present application is a DIV application based on the U.S. patent application Ser. No. 12/049,567 filed on Mar. 17, 2008 now U.S. Pat. No. 7,714,646.

BACKGROUND

1. Field of Invention

The present invention relates to a power amplifier. More particularly, the present invention relates to a power amplifier for amplifying an audio signal.

2. Description of Related Art

Many types of electronic audio amplifiers are used today for commercial public address systems, automobile stereo systems as well as portable battery operated products including two-way radios. These audio amplifiers have varying power requirements and amplification characteristics. One general type of audio amplifier is a Class D amplifier. Class D amplifiers exhibit a high efficiency and are commonly used with pulse width modulated (PWM) drivers. As is well known in the art, a class D audio power amplifier typically uses a complementary metal oxide semiconductor (CMOS) inverter whose logic state is switched depending on the PWM pulse.

Pulse width modulation (PWM), sometimes referred to as pulse duration modulation, is a signal processing technique in which a sample value of an input information signal is represented by some property of a resultant pulse other than an amplitude value. When PWM is used, the samples of a message are used to vary the duration of the individual pulses. Thus with PWM, input information is encoded into the time parameter instead of amplitude. The modulating input wave may vary the time of occurrence of the leading edge trailing edge or both edges of the resultant pulse train.

However, when the audio power amplifier powers on, there might be a large dc current flowing into the amplifier and the load driven by the amplifier, which might damage the load and produce the unpleasant pop noise.

Hence, there is a need for a new audio power amplifier which can prevent the pop noise, and prevent the load from being damaged by the large dc current when the amplifier powers on.

SUMMARY

According to one embodiment of the present invention, an audio power to amplifier includes a pre-amplifier, an error amplifier, a comparator, a bridge circuit, and a feedback circuit, in which the gain of the pre-amplifier gradually increases when the audio power amplifier is powered on.

The pre-amplifier amplifies an audio signal. The error amplifier generates an error signal by comparing the amplified audio signal and a feedback signal. The comparator generates a PWM signal by comparing a reference signal and the amplified audio signal. The bridge circuit has switches controlled according to the PWM signal such that a driving current alternately flows to and from a load. The feedback circuit generates the feedback signal indicating a condition of the load.

According to another embodiment of the present invention, a pre-amplifier, controlling a voltage gain of an audio signal, includes an operational amplifier and an input signal controller. The operational amplifier has a first input terminal receiving a reference voltage. The input signal controller is connected between an output terminal and a second input terminal of the operational amplifier. The input signal controller receives a voltage signal whose voltage level gradually decreases when the audio power amplifier is powered on.

It is to be understood that both the foregoing general description and the following detailed description are by examples, and are intended to provide further explanation of the invention as claimed.

BRIEF DESCRIPTION OF THE DRAWINGS

These and other features, aspects, and advantages of the present invention will become better understood with regard to the following description, appended claims, and accompanying drawings where:

FIG. 1A is a schematic diagram showing voltage level decrease over time.

DESCRIPTION OF THE PREFERRED EMBODIMENTS

Figure 1:
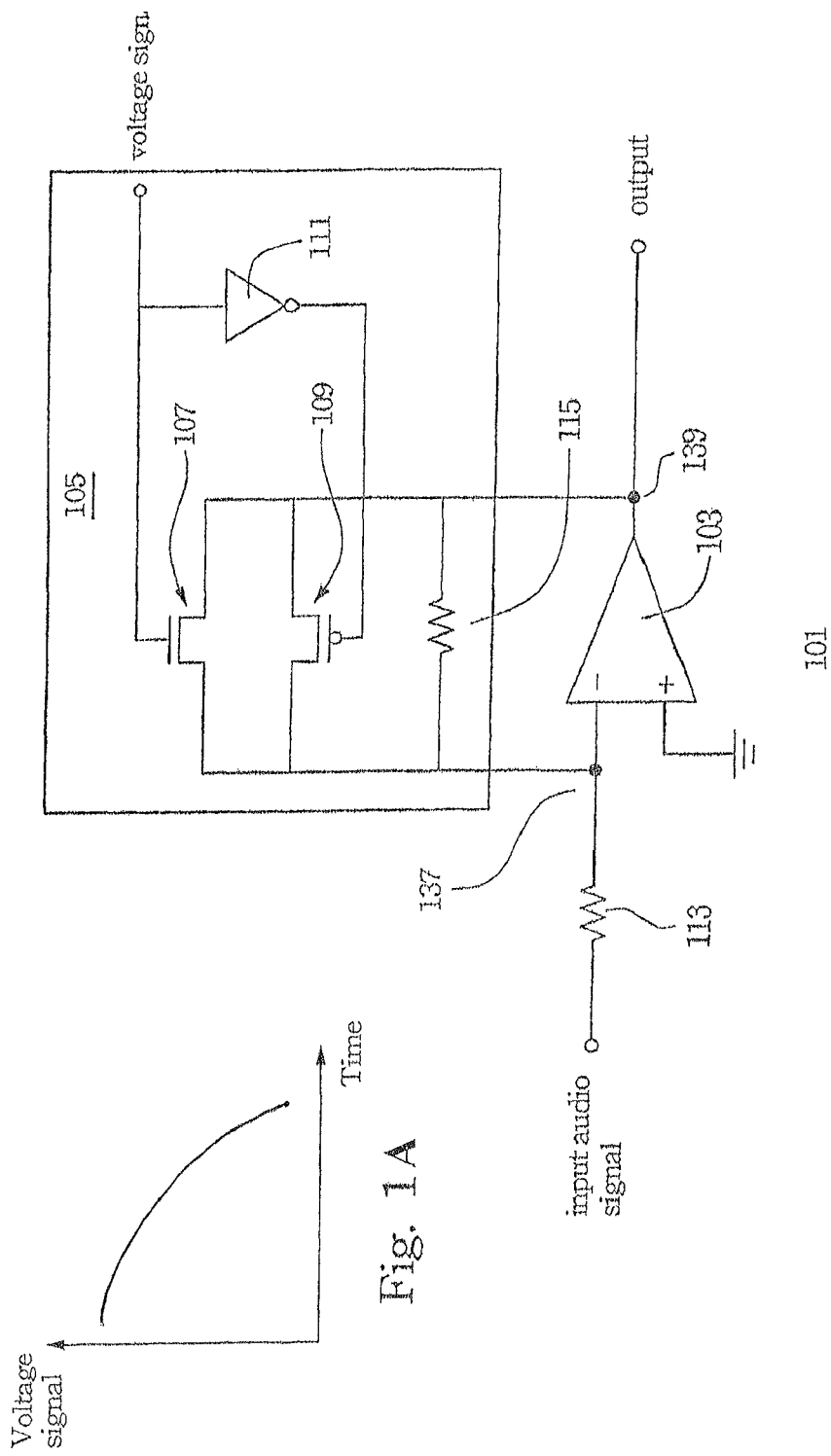
FIG. 1 shows the pre-amplifier according to one embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

The audio power amplifier of the embodiments shown below can amplify the input audio signal gradually, which prevents the pop noise and prevents the amplifier and the load from being damaged by the large dc current when the amplifier powers on.

FIG. 1 shows the pre-amplifier according to one embodiment of the present invention. The pre-amplifier 101 gradually increases the voltage gain of the input audio signal thereby preventing a large dc current from flowing into the audio power amplifier and the load. This prevents the audio power amplifier and the load from being damaged and eliminates the unpleasant pop noise when the audio power amplifier is powered on.

The pre-amplifier 101 includes an operational amplifier 103, an input to signal controller 105, and a resistor 113 electrically connected to the second input terminal 137 of the operation amplifier 103. The output terminal 139 and the second input terminal (negative input terminal) 137 of the operational amplifier 103 are connected to the input signal controller 105, while the first input terminal (positive input terminal) of the operational amplifier 103 receives a reference voltage which is the ground voltage here.

The input signal controller 105 includes a first transistor 107, a second transistor 109, a resistor 115 connected to the second input terminal 137 of the operation amplifier 103, and an inverter 111 connected to the gate of the second transistor 109.

The first transistor 107 has a first drain/source connected to the output terminal 139 of the operational amplifier 103, a second drain/source connected to the second input terminal 137 of the operational amplifier 103, and a gate receiving the voltage signal. The second transistor 109 has a first drain/source connected to the output terminal 139 of the operational amplifier 103, a second drain/source connected to the second input terminal 137 of the operational amplifier 103, and a gate receiving an inverted signal of the voltage signal.

In order to make the voltage gain of the input audio signal increases gradually, the impedance of the input signal controller 105 needs to increase gradually as well. Furthermore, because the impedance of the input signal controller 105 needs to increase gradually, the voltage level of the voltage signal, which drives the first transistor 107 and the second transistor 109, needs to decrease gradually when the audio power amplifier is powered on, such that the impedances of the first transistor 107 and the second transistor 109 increase gradually as a result. This is illustrated in FIG. 1A.

Figure 2:
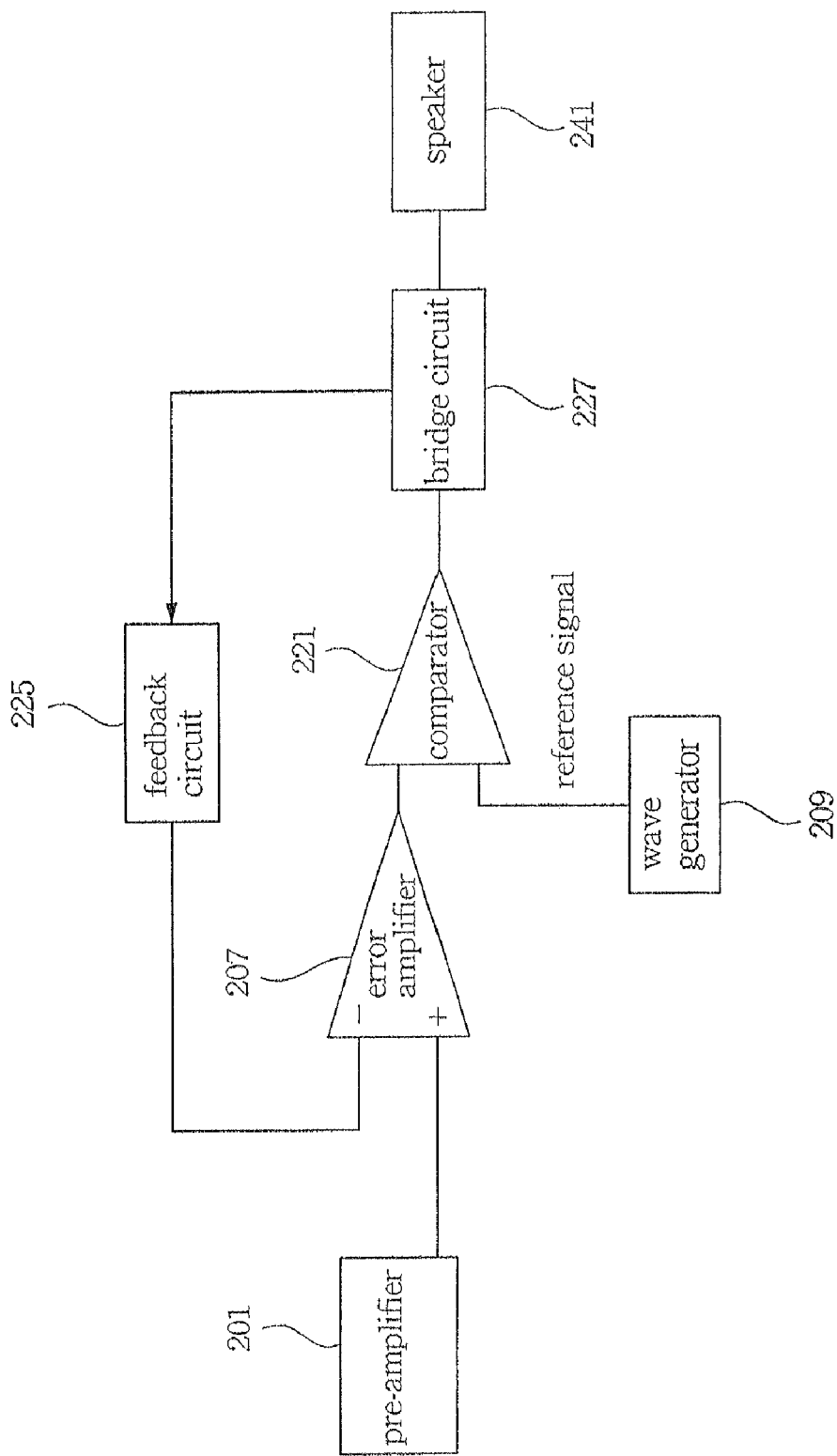
FIG. 2 shows the audio power amplifier according to one embodiment of is the present invention.

FIG. 2 shows the audio power amplifier according to one embodiment of the present invention. The audio power amplifier includes a pre-amplifier 201, an error amplifier 207, a comparator 221, a bridge circuit 227, a wave generator 209, and a feedback circuit 225. The pre-amplifier 201 amplifies an audio signal, such as the human voice or the music, in which the gain of the pre-amplifier gradually increases when the audio power amplifier powers on, such that large dc current doesn't flow into the audio power amplifier and the load. This prevents the audio power amplifier and the load from being damaged and eliminates the unpleasant pop noise.

The wave generator 209 generates a reference signal, a triangular wave for example, and the comparator 221 compares the generated reference signal and the amplified audio signal to produce a PWM signal. The PWM signal generated by the comparator 221 controls the bridge circuit 227 to induce the driving current to alternately flow to and from a load, the speaker 241 here, to play the audio signal. The feedback circuit 225 detects the condition of the bridge circuit 227 and generates the feedback signal accordingly. Then the error amplifier 207 compares the amplified audio signal and the feedback signal to produce an error signal.

Figure 3:
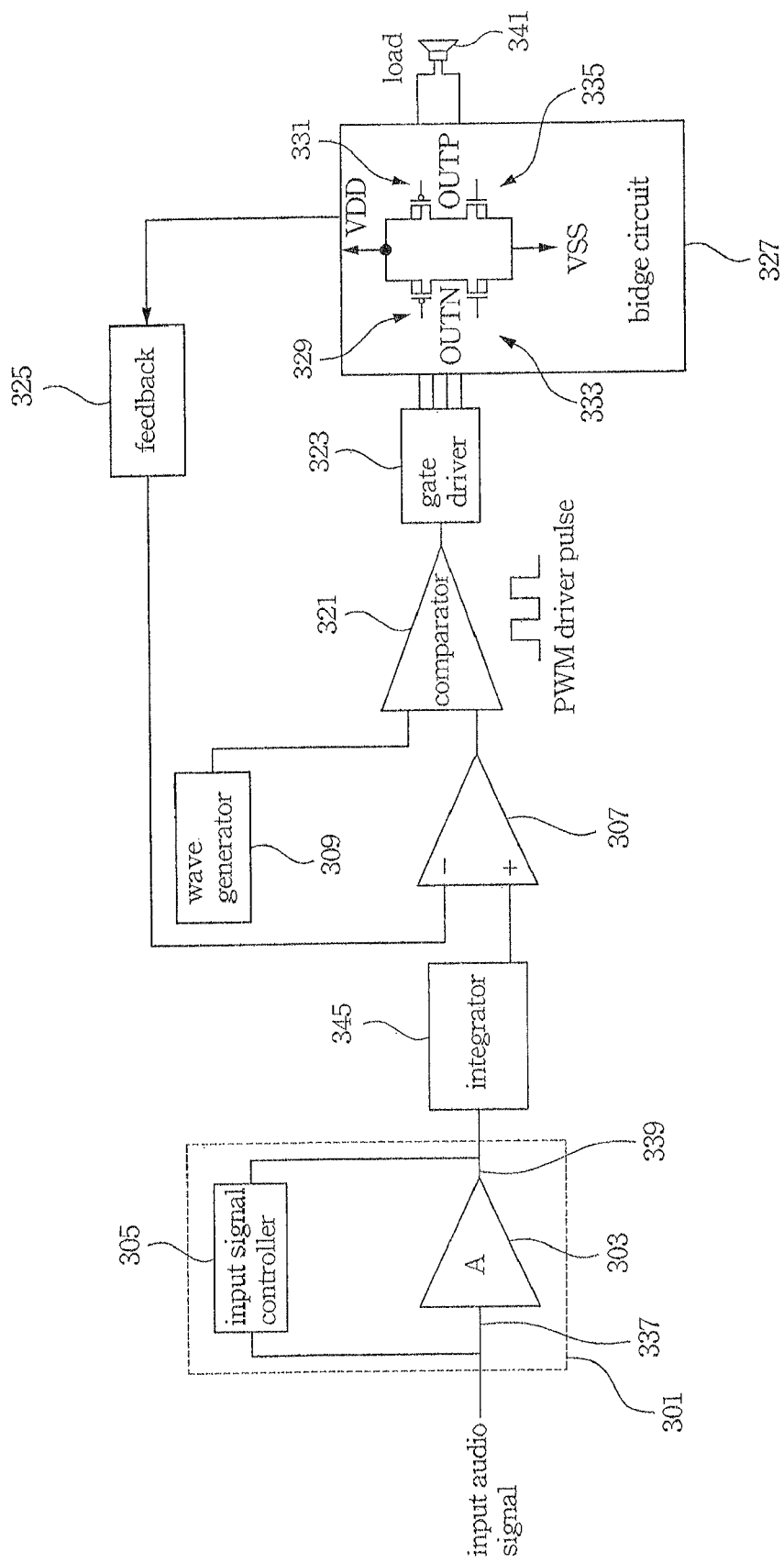
FIG. 3 shows the audio power amplifier according to another embodiment of the present invention.

FIG. 3 shows the audio power amplifier according to another embodiment of the present invention. Similarly, the pre-amplifier 301 is used to amplify the input audio signal gradually. In addition to the pre-amplifier 301, the error amplifier 307, the comparator 321, the bridge circuit 327, the wave generator 309, and the feedback circuit 325, the audio power amplifier further includes the integrator 345 and the gate driver 323. To eliminate the aliasing phenomenon and make the whole amplifier stable, the integrator 345, is electrically connected between the pre-amplifier 301 and the error amplifier 307, and filters out the high frequency signals, such as the high frequency noises.

The gate driver 323 is electrically connected between the comparator 321 and the bridge circuit 327 and drives the bridge circuit 327 according to the is PWN signal generated by the comparator 321. Because the bridge circuit 327 usually has a large capacitance, and the comparator 321 can't drive the bridge circuit 327 efficiently on its own, the gate driver 323 is required to drive the bridge circuit 327 effectively.

The bridge circuit 327 includes the switches (P-type transistor 329/321 and N-type transistor 333/335) connected in a full-bridge configuration. Because the ideal impedance of the output transistor 329/321/333/335 is zero when the output transistor 329/321/333/335 is on, and is infinite when the output transistor 329/321/333/335 is off, the voltage drop caused by the output transistors 329/321/333/335 is small and can be neglected.

Due to the above impedance characteristic of the output transistors 329/321/333/335, the PWM signal makes the output voltage (voltage drop between the OUTP and the OUTN) switch between the supply voltage VDD and VSS when driving current flows to and from the load. In this case, the power loss caused by the output transistor 329/321/333/335 is small, and the power from the supply voltage can be transmitted to the load more efficiently.

According to the above embodiments, with the pre-amplifier, the audio power amplifier can amplify the input audio signal gradually, which prevents the pop noise and prevents the load and the amplifier from being damaged by the large dc current when the amplifier powers on.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A pre-amplifier for controlling a voltage gain of an audio signal, comprising:
    an operational amplifier having a first input terminal receiving a reference voltage; and
    an input signal controller connected between an output terminal and a second input terminal of the operational amplifier, wherein the input signal controller receives a voltage signal whose voltage level gradually decreases when an audio power amplifier is powered on, wherein the input signal controller comprises:
    a first transistor having a first drain/source connected to the output terminal of the operational amplifier, a second drain/source connected to the second input terminal of the operational amplifier and a gate receiving the voltage signal;
    a resistor connected between the output terminal and the second input terminal of the operational amplifier;
    a second transistor having a first drain/source connected to the output terminal of the operational amplifier, a second drain/source connected to the second input terminal of the operational amplifier and a gate receiving an inverted signal of the voltage signal; and
    an inverter connected to the second transistor.

* * * * *